(12) United States Patent
Janko et al.

(10) Patent No.: US 11,139,767 B2
(45) Date of Patent: Oct. 5, 2021

(54) METHODS AND APPARATUS FOR DRIVING A TRANSDUCER

(71) Applicant: Cirrus Logic International Semiconductor Ltd., Edinburgh (GB)

(72) Inventors: Marco Janko, Austin, TX (US); Harsha Rao, Austin, TX (US); Carl Ståhl, Malmö (SE); Rong Hu, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/207,340

(22) Filed: Dec. 3, 2018

(65) Prior Publication Data
US 2019/0296674 A1 Sep. 26, 2019

Related U.S. Application Data

(60) Provisional application No. 62/646,563, filed on Mar. 22, 2018.

(51) Int. Cl.
*B66C 1/10* (2006.01)
*H02P 25/034* (2016.01)
(Continued)

(52) U.S. Cl.
CPC .......... *H02P 25/034* (2016.02); *B06B 1/0253* (2013.01); *G06F 3/016* (2013.01);
(Continued)

(58) Field of Classification Search
CPC ......... B06B 1/0253; G06F 3/016; G08B 6/00; H02P 21/0007; H02P 21/13; H02P 21/18;
(Continued)

(56) References Cited

U.S. PATENT DOCUMENTS

| 3,686,927 A | 8/1972 | Scharton |
| 4,902,136 A | 2/1990 | Mueller et al. |

(Continued)

FOREIGN PATENT DOCUMENTS

| AU | 2002347829 | 4/2003 |
| CN | 103165328 A | 6/2013 |

(Continued)

OTHER PUBLICATIONS

International Search Report and Written Opinion of the International Searching Authority, International Application No. PCT/GB2019/050770, dated Jul. 5, 2019.

(Continued)

*Primary Examiner* — Muhammad S Islam
(74) *Attorney, Agent, or Firm* — Jackson Walker L.L.P.

(57) ABSTRACT

According to embodiments described herein, there are provided methods and apparatus for providing a driving signal to a transducer, wherein the driving signal is output by an amplifier. A method comprises receiving an indication of a voltage and a current of the driving signal; based on an electrical model of the transducer and the voltage and the current of the driving signal, estimating an estimated electrical response of the transducer representative of movement of a mass in the transducer; comparing the estimated electrical response to a desired electrical response; and controlling the driving signal based on the comparison.

26 Claims, 5 Drawing Sheets

(51) Int. Cl.
  *H02P 21/00* (2016.01)
  *H02P 21/13* (2006.01)
  *H02P 21/22* (2016.01)
  *H03H 17/02* (2006.01)
  *G08B 6/00* (2006.01)
  *H02P 21/18* (2016.01)
  *G06F 3/01* (2006.01)
  *B06B 1/02* (2006.01)

(52) U.S. Cl.
  CPC ............ *G08B 6/00* (2013.01); *H02P 21/0007* (2013.01); *H02P 21/13* (2013.01); *H02P 21/18* (2016.02); *H02P 21/22* (2016.02); *H03H 17/0202* (2013.01); *H03H 2017/0205* (2013.01)

(58) Field of Classification Search
  CPC ........ H02P 21/22; H02P 23/12; H02P 25/034; H03H 17/0202; H03H 2017/0205
  See application file for complete search history.

(56) References Cited

U.S. PATENT DOCUMENTS

| | | |
|---|---|---|
| 5,684,722 A | 11/1997 | Thorner et al. |
| 5,748,578 A | 5/1998 | Schell |
| 5,857,986 A | 1/1999 | Moriyasu |
| 6,050,393 A | 4/2000 | Murai et al. |
| 6,278,790 B1 | 8/2001 | David et al. |
| 6,332,029 B1 | 12/2001 | Azima et al. |
| 6,388,520 B2 | 5/2002 | Wada et al. |
| 6,580,796 B1 | 6/2003 | Kuroki |
| 6,683,437 B2 | 1/2004 | Tierling |
| 6,703,550 B2 | 3/2004 | Chu |
| 6,762,745 B1 | 7/2004 | Braun et al. |
| 6,906,697 B2 | 6/2005 | Rosenberg |
| 6,995,747 B2 | 2/2006 | Casebolt et al. |
| 7,154,470 B2 | 12/2006 | Tierling |
| 7,623,114 B2 | 11/2009 | Rank |
| 7,639,232 B2 | 12/2009 | Grant et al. |
| 7,791,588 B2 | 9/2010 | Tierling et al. |
| 7,979,146 B2 * | 7/2011 | Ullrich .................... G10L 21/06 340/407.1 |
| 8,068,025 B2 | 11/2011 | Devenyi et al. |
| 8,098,234 B2 | 1/2012 | Lacroix et al. |
| 8,102,364 B2 | 1/2012 | Tierling |
| 8,325,144 B1 | 12/2012 | Tierling et al. |
| 8,427,286 B2 | 4/2013 | Grant et al. |
| 8,441,444 B2 | 5/2013 | Moore et al. |
| 8,466,778 B2 | 6/2013 | Hwang et al. |
| 8,480,240 B2 | 7/2013 | Kashiyama |
| 8,572,293 B2 | 10/2013 | Cruz-Hernandez et al. |
| 8,572,296 B2 | 10/2013 | Shasha et al. |
| 8,593,269 B2 | 11/2013 | Grant et al. |
| 8,648,829 B2 | 2/2014 | Shahoian et al. |
| 8,659,208 B1 | 2/2014 | Rose et al. |
| 8,754,757 B1 | 6/2014 | Ullrich et al. |
| 8,947,216 B2 | 2/2015 | Da Costa et al. |
| 8,981,915 B2 | 3/2015 | Bimbaum et al. |
| 8,994,518 B2 | 3/2015 | Gregorio et al. |
| 9,030,428 B2 | 5/2015 | Fleming |
| 9,063,570 B2 | 6/2015 | Weddle et al. |
| 9,083,821 B2 | 7/2015 | Hughes |
| 9,092,059 B2 | 7/2015 | Bhatia |
| 9,117,347 B2 | 8/2015 | Matthews |
| 9,128,523 B2 | 9/2015 | Buuck et al. |
| 9,164,587 B2 | 10/2015 | Da Costa et al. |
| 9,196,135 B2 | 11/2015 | Shah et al. |
| 9,248,840 B2 | 2/2016 | Truong |
| 9,326,066 B2 | 4/2016 | Klippel |
| 9,329,721 B1 | 5/2016 | Buuck et al. |
| 9,354,704 B2 | 5/2016 | Lacroix et al. |
| 9,368,005 B2 | 6/2016 | Cruz-Hernandez et al. |
| 9,489,047 B2 | 11/2016 | Jiang et al. |
| 9,507,423 B2 | 11/2016 | Gandhi et al. |
| 9,513,709 B2 | 12/2016 | Gregorio et al. |
| 9,520,036 B1 | 12/2016 | Buuck |
| 9,588,586 B2 | 3/2017 | Rihn |
| 9,640,047 B2 | 5/2017 | Choi et al. |
| 9,652,041 B2 | 5/2017 | Jiang et al. |
| 9,697,450 B1 | 7/2017 | Lee |
| 9,715,300 B2 | 7/2017 | Sinclair |
| 9,740,381 B1 | 8/2017 | Chaudhri et al. |
| 9,842,476 B2 | 12/2017 | Rihn et al. |
| 9,864,567 B2 | 1/2018 | Seo |
| 9,881,467 B2 | 1/2018 | Levesque |
| 9,886,829 B2 | 2/2018 | Levesque |
| 9,946,348 B2 | 4/2018 | Saboune et al. |
| 9,947,186 B2 | 4/2018 | Macours |
| 9,959,744 B2 | 5/2018 | Koskan et al. |
| 9,965,092 B2 | 5/2018 | Smith |
| 10,032,550 B1 | 7/2018 | Zhang et al. |
| 10,055,950 B2 | 8/2018 | Bhatia et al. |
| 10,074,246 B2 | 9/2018 | Da Costa et al. |
| 10,110,152 B1 | 10/2018 | Hajati |
| 10,171,008 B2 | 1/2019 | Nishitani et al. |
| 10,175,763 B2 | 1/2019 | Shah |
| 10,264,348 B1 | 4/2019 | Harris et al. |
| 10,275,087 B1 | 4/2019 | Smith |
| 10,564,727 B2 | 2/2020 | Billington et al. |
| 10,620,704 B2 | 4/2020 | Rand et al. |
| 10,667,051 B2 | 5/2020 | Stahl |
| 10,782,785 B2 | 9/2020 | Hu et al. |
| 10,795,443 B2 | 10/2020 | Hu et al. |
| 10,828,672 B2 | 11/2020 | Stahl et al. |
| 10,832,537 B2 | 11/2020 | Doy et al. |
| 2001/0043714 A1 | 11/2001 | Asada et al. |
| 2002/0018578 A1 | 2/2002 | Burton |
| 2003/0068053 A1 | 4/2003 | Chu |
| 2003/0214485 A1 | 11/2003 | Roberts |
| 2005/0031140 A1 | 2/2005 | Browning |
| 2005/0134562 A1 | 6/2005 | Grant et al. |
| 2006/0028095 A1 | 2/2006 | Maruyama et al. |
| 2006/0197753 A1 | 9/2006 | Hotelling |
| 2006/0284856 A1 | 12/2006 | Soss |
| 2008/0167832 A1 | 7/2008 | Soss |
| 2008/0226109 A1 | 9/2008 | Yamakata et al. |
| 2008/0240458 A1 | 10/2008 | Goldstein et al. |
| 2008/0293453 A1 | 11/2008 | Atlas et al. |
| 2008/0316181 A1 | 12/2008 | Nurmi |
| 2009/0020343 A1 | 1/2009 | Rothkopf et al. |
| 2009/0079690 A1 | 3/2009 | Watson et al. |
| 2009/0088220 A1 | 4/2009 | Persson |
| 2009/0096632 A1 | 4/2009 | Ullrich et al. |
| 2009/0102805 A1 | 4/2009 | Meijer et al. |
| 2009/0153499 A1 | 6/2009 | Kim et al. |
| 2009/0278819 A1 | 11/2009 | Goldenberg et al. |
| 2010/0013761 A1 | 1/2010 | Bimbaum et al. |
| 2010/0141408 A1 | 6/2010 | Doy et al. |
| 2010/0141606 A1 | 6/2010 | Bae et al. |
| 2011/0056763 A1 | 3/2011 | Tanase et al. |
| 2011/0141052 A1 | 6/2011 | Bemstein et al. |
| 2011/0163985 A1 | 7/2011 | Bae et al. |
| 2011/0167391 A1 | 7/2011 | Momeyer et al. |
| 2012/0011436 A1 | 1/2012 | Jinkinson et al. |
| 2012/0105358 A1 | 5/2012 | Momeyer et al. |
| 2012/0112894 A1 | 5/2012 | Yang et al. |
| 2012/0206246 A1 | 8/2012 | Cruz-Hernandez et al. |
| 2012/0206247 A1 | 8/2012 | Bhatia et al. |
| 2012/0229264 A1 | 9/2012 | Company Bosch et al. |
| 2012/0253698 A1 | 10/2012 | Cokonaj |
| 2012/0306631 A1 | 12/2012 | Hughes |
| 2013/0027359 A1 | 1/2013 | Schevin et al. |
| 2013/0038792 A1 | 2/2013 | Quigley et al. |
| 2013/0141382 A1 | 6/2013 | Modarres et al. |
| 2013/0275058 A1 | 10/2013 | Awad |
| 2013/0289994 A1 | 10/2013 | Newman et al. |
| 2014/0056461 A1 | 2/2014 | Afshar |
| 2014/0064516 A1 | 3/2014 | Cruz-Hernandez et al. |
| 2014/0079248 A1 | 3/2014 | Short et al. |
| 2014/0085064 A1 | 3/2014 | Crawley et al. |
| 2014/0118125 A1 | 5/2014 | Bhatia |
| 2014/0118126 A1 | 5/2014 | Garg et al. |

(56) References Cited

U.S. PATENT DOCUMENTS

| | | | |
|---|---|---|---|
| 2014/0119244 A1 | 5/2014 | Steer et al. | |
| 2014/0139327 A1 | 5/2014 | Bau et al. | |
| 2014/0226068 A1 | 8/2014 | Lacroix et al. | |
| 2014/0292501 A1* | 10/2014 | Lim | G08B 6/00 340/407.2 |
| 2014/0340209 A1 | 11/2014 | Lacroix et al. | |
| 2014/0347176 A1 | 11/2014 | Modarres et al. | |
| 2015/0061846 A1 | 3/2015 | Yliaho | |
| 2015/0070260 A1 | 3/2015 | Saboune et al. | |
| 2015/0084752 A1 | 3/2015 | Heubel et al. | |
| 2015/0130767 A1 | 5/2015 | Myers et al. | |
| 2015/0208189 A1 | 7/2015 | Tsai | |
| 2015/0216762 A1 | 8/2015 | Oohashi et al. | |
| 2015/0324116 A1 | 11/2015 | Marsden et al. | |
| 2015/0325116 A1 | 11/2015 | Umminger, III | |
| 2015/0341714 A1 | 11/2015 | Ahn et al. | |
| 2016/0063826 A1 | 3/2016 | Morrell et al. | |
| 2016/0070392 A1 | 3/2016 | Wang et al. | |
| 2016/0074278 A1 | 3/2016 | Muench et al. | |
| 2016/0132118 A1 | 5/2016 | Park et al. | |
| 2016/0162031 A1 | 6/2016 | Westerman et al. | |
| 2016/0179203 A1 | 6/2016 | Modarres et al. | |
| 2016/0239089 A1 | 8/2016 | Taninaka et al. | |
| 2016/0246378 A1 | 8/2016 | Sampanes et al. | |
| 2016/0358605 A1 | 12/2016 | Ganong, III et al. | |
| 2017/0052593 A1 | 2/2017 | Jiang et al. | |
| 2017/0078804 A1 | 3/2017 | Guo et al. | |
| 2017/0090572 A1 | 3/2017 | Holensipur et al. | |
| 2017/0090573 A1 | 3/2017 | Hajati et al. | |
| 2017/0153760 A1 | 6/2017 | Chawda et al. | |
| 2017/0168574 A1 | 6/2017 | Zhang | |
| 2017/0083096 A1 | 8/2017 | Matsumoto et al. | |
| 2017/0220197 A1 | 8/2017 | Matsumoto et al. | |
| 2017/0256145 A1 | 9/2017 | Macours et al. | |
| 2017/0277350 A1 | 9/2017 | Wang et al. | |
| 2017/0357440 A1 | 12/2017 | Tse | |
| 2018/0059793 A1* | 3/2018 | Hajati | H02K 33/02 |
| 2018/0067557 A1 | 3/2018 | Robert et al. | |
| 2018/0074637 A1 | 3/2018 | Rosenberg et al. | |
| 2018/0082673 A1 | 3/2018 | Tzanetos | |
| 2018/0084362 A1 | 3/2018 | Zhang et al. | |
| 2018/0151036 A1 | 5/2018 | Cha et al. | |
| 2018/0158289 A1 | 6/2018 | Vasilev et al. | |
| 2018/0160227 A1 | 6/2018 | Lawrence et al. | |
| 2018/0178114 A1 | 6/2018 | Mizuta et al. | |
| 2018/0182212 A1 | 6/2018 | Li et al. | |
| 2018/0183372 A1 | 6/2018 | Li et al. | |
| 2018/0196567 A1 | 7/2018 | Klein et al. | |
| 2018/0237033 A1 | 8/2018 | Hakeem et al. | |
| 2018/0253123 A1 | 9/2018 | Levesque et al. | |
| 2018/0267897 A1 | 9/2018 | Jeong | |
| 2018/0294757 A1 | 10/2018 | Feng et al. | |
| 2018/0301060 A1 | 10/2018 | Israr et al. | |
| 2018/0321748 A1 | 11/2018 | Rao et al. | |
| 2018/0329172 A1 | 11/2018 | Tabuchi | |
| 2018/0335848 A1 | 11/2018 | Moussette et al. | |
| 2018/0367897 A1 | 12/2018 | Bjork et al. | |
| 2019/0227628 A1 | 1/2019 | Rand et al. | |
| 2019/0064925 A1 | 2/2019 | Kim et al. | |
| 2019/0073078 A1 | 3/2019 | Sheng et al. | |
| 2019/0103829 A1 | 4/2019 | Vasudevan et al. | |
| 2019/0138098 A1 | 5/2019 | Shah | |
| 2019/0163234 A1 | 5/2019 | Kim et al. | |
| 2019/0206396 A1 | 7/2019 | Chen | |
| 2019/0215349 A1 | 7/2019 | Adams et al. | |
| 2019/0114496 A1 | 8/2019 | Lesso | |
| 2019/0235629 A1 | 8/2019 | Hu et al. | |
| 2019/0294247 A1 | 9/2019 | Hu et al. | |
| 2019/0297418 A1 | 9/2019 | Stahl | |
| 2019/0311590 A1 | 10/2019 | Doy et al. | |
| 2019/0341903 A1 | 11/2019 | Kim | |
| 2020/0117506 A1 | 4/2020 | Chan | |
| 2020/0218352 A1 | 7/2020 | Macours et al. | |

FOREIGN PATENT DOCUMENTS

| | | |
|---|---|---|
| CN | 103403796 A | 11/2013 |
| CN | 204903757 U | 12/2015 |
| CN | 105264551 A | 1/2016 |
| CN | 106438890 A | 2/2017 |
| CN | 106950832 A | 7/2017 |
| CN | 107665051 A | 2/2018 |
| EP | 0784844 B1 | 6/2005 |
| EP | 2363785 A1 | 9/2011 |
| EP | 2487780 A1 | 8/2012 |
| EP | 2600225 A1 | 6/2013 |
| EP | 2846218 A1 | 3/2015 |
| EP | 2846229 A2 | 3/2015 |
| EP | 2846329 A1 | 3/2015 |
| EP | 2988528 A1 | 2/2016 |
| EP | 3125508 A1 | 2/2017 |
| EP | 3379382 A1 | 9/2018 |
| IN | 201747044027 | 8/2018 |
| JP | H02130433 B2 | 5/1990 |
| JP | H08149006 A | 6/1996 |
| JP | 6026751 B2 | 11/2016 |
| JP | 6250985 | 12/2017 |
| JP | 6321351 | 5/2018 |
| KR | 20120126446 A | 11/2012 |
| WO | 2013104919 A1 | 7/2013 |
| WO | 2013186845 A1 | 12/2013 |
| WO | 2014018086 A1 | 1/2014 |
| WO | 2014094283 A1 | 6/2014 |
| WO | 2016105496 A1 | 6/2016 |
| WO | 2016164193 A1 | 10/2016 |
| WO | 2017113651 A1 | 7/2017 |
| WO | 2018053159 A1 | 3/2018 |
| WO | 2018067613 A1 | 4/2018 |
| WO | 2018125347 A1 | 7/2018 |
| WO | 2020004840 A1 | 1/2020 |
| WO | 2020055405 A1 | 3/2020 |

OTHER PUBLICATIONS

International Search Report and Written Opinion of the International Searching Authority, International Application No. PCT/US2020/023342, dated Jun. 9, 2020.

International Search Report and Written Opinion of the International Searching Authority, International Application No. PCT/GB2020/050823, dated Jun. 30, 2020.

International Search Report and Written Opinion of the International Searching Authority, International Application No. PCT/GB2020/051037, dated Jul. 9, 2020.

International Search Report and Written Opinion of the International Searching Authority, International Application No. PCT/GB2020/051035, dated Jul. 10, 2020.

International Search Report and Written Opinion of the International Searching Authority, International Application No. PCT/US2020/024864, dated Jul. 6, 2020.

International Search Report and Written Opinion of the International Searching Authority, International Application No. PCT/GB2019/050964, dated Sep. 3, 2019.

Combined Search and Examination Report UKIPO, Application No. GB1720424.9, dated Jun. 5, 2018.

Communication Relating to the Results of the Partial International Search, and Provisional Opinion Accompanying the Partial Search Result, of the International Searching Authority, International Application No. PCT/US2018/031329, dated Jul. 20, 2018.

Communication Relating to the Results of the Partial International Search, and Provisional Opinion Accompanying the Partial Search Result, of the International Searching Authority, International Application No. PCT/GB2020/050822, dated Jul. 9, 2020.

International Search Report and Written Opinion of the International Searching Authority, International Application No. PCT/GB2020/051438, dated Sep. 28, 2020.

First Examination Opinion Notice, State Intellectual Property Office of the People's Republic of China, Application No. 201880037435.X, dated Dec. 31, 2020.

(56) References Cited

OTHER PUBLICATIONS

International Search Report and Written Opinion of the International Searching Authority, International Application No. PCT/US2020/056610, dated Jan. 21, 2021.
Office Action of the Intellectual Property Office, ROC (Taiwan) Patent Application No. 107115475, dated Apr. 30, 2021.
First Office Action, China National Intellectual Property Administration, Patent Application No. 2019800208570, dated Jun. 3, 2021.
International Search Report and Written Opinion of the International Searching Authority, International Application No. PCT/US2021/021908, dated Jun. 9, 2021.
International Search Report and Written Opinion of the International Searching Authority, International Application No. PCT/GB2020/052537, dated Mar. 9, 2021.
Notice of Preliminary Rejection, Korean Intellectual Property Office, Application No. 10-2019-7036236, dated Jun. 29, 2021.
Combined Search and Examination Report, United Kingdom Intellectual Property Office, Application No. GB2018051.9, dated Jun. 30, 2021.
Communication pursuant to Rule 164(2)(b) and Article 94(3) EPC, European Patent Office, Application No. 18727512.8, dated Jul. 8, 2021.
Gottfried Behler: "Measuring the Loudspeaker's Impedance during Operation for the Derivation of the Voice Coil Temperature", AES CONVENTION PREPRINT, Feb. 25, 1995 (Feb. 25, 1995), Paris.

\* cited by examiner

METHODS AND APPARATUS FOR DRIVING A TRANSDUCER

TECHNICAL FIELD

Embodiments described herein relate to methods and apparatus for driving a transducer, in particular a haptic transducer, such that the acceleration and/or deceleration time of the transducer may be compensated.

BACKGROUND

Linear Resonant Actuators (LRAs) are devices which may be used to stimulate the vibro-tactile sensing system of the human body in order to elicit touch sensations programmatically. The human tactile system is particularly sensitive to vibrations of a frequency within the range 100 Hz to 400 Hz. LRAs may be used to stimulate the tactile system directly through controlled vibrations. These vibrations may be achieved by applying an electromechanical force to a small mass held by a spring, or set of springs. The electromechanical force may be elicited by applying an input voltage (usually oscillatory) to the LRA which makes the inner mass of the LRA move.

LRAs may be designed to have a resonant frequency (FO) in the range of 150 Hz to 200 Hz. This resonance characteristic implies, in most cases, a relatively large acceleration rise time.

As illustrated in FIGS. 1A and 1B, after the LRAs mass is set in motion, removing the input voltage may not stop the motion of the mass instantaneously. Instead, the mass may continue to oscillate and decay slowly.

FIG. 1A illustrates an example voltage input into a haptic transducer. FIG. 1B illustrates the corresponding response of the haptic transducer to the voltage signal illustrated in FIG. 1A. As can be seen, the 2V voltage input starts at time 0 s, but the haptic transducer takes until time 0.05 s to reach maximum acceleration. Furthermore, when the 2V input is removed at time 0.175 s, the acceleration of the haptic transducer starts to decay but does not reach zero until at least 0.3 s.

Haptic applications may seek to drive haptic transducers near resonance frequency to obtain the highest vibration amplitude (i.e. acceleration) per unit of input power. By driving a haptic transducer at resonance frequency, applications may save in energy consumption, or may elicit stronger vibration stimulation to a user. Furthermore, in other applications not involving near-resonance actuation, the resonance frequency of the haptic transducer may still constrain the rise and stop times of the response of the haptic transducer.

It may therefore be beneficial to control the time taken for a haptic transducer to accelerate and decelerate.

SUMMARY

According to embodiments described herein, there is provided a method for providing a driving signal to a transducer, wherein the driving signal is output by an amplifier. The method comprises receiving an indication of a voltage and a current of the driving signal; based on an electrical model of the transducer and the voltage and the current of the driving signal, estimating an estimated electrical response of the transducer representative of movement of a mass in the transducer; comparing the estimated electrical response to a desired electrical response; and controlling the driving signal based on the comparison.

According to some embodiments, there is provided a controller for controlling a driving signal to a transducer, wherein the driving signal is output by an amplifier. The controller comprises an estimation block configured to: receive an indication of a voltage and a current of the driving signal; and based on an electrical model of the transducer and the voltage and the current of the driving signal, estimate an estimated electrical response of the transducer representative of movement of a mass in the transducer. The controller further comprises a comparison block configured to compare the estimated electrical response to a desired electrical response; wherein the controller is configured to control the driving signal based on the comparison.

According to some embodiments, there is provided an electronic apparatus. The electronic apparatus comprises a haptic transducer; and an integrated circuit. The integrated circuit comprises an amplifier configured to output a driving signal to the haptic transducer; and a controller comprising: an estimation block configured to receive an indication of a voltage and a current of the driving signal; and based on an electrical model of the transducer and the voltage and the current of the driving signal, estimate an estimated electrical response of the transducer representative of movement of a mass in the transducer; and a comparison block configured to compare the estimated electrical response to a desired electrical response; wherein the controller is configured to control the driving signal based on the comparison.

BRIEF DESCRIPTION OF THE DRAWINGS

For a better understanding of the embodiments of the present disclosure, and to show how it may be put into effect, reference will now be made, by way of example only, to the accompanying drawings, in which:—

DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, or any acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications, and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g. a socket, for making a removable mating connection with a corresponding connector of an accessory apparatus and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal will generally be an analog time varying voltage signal, for example, a time varying waveform.

Figure 1A:
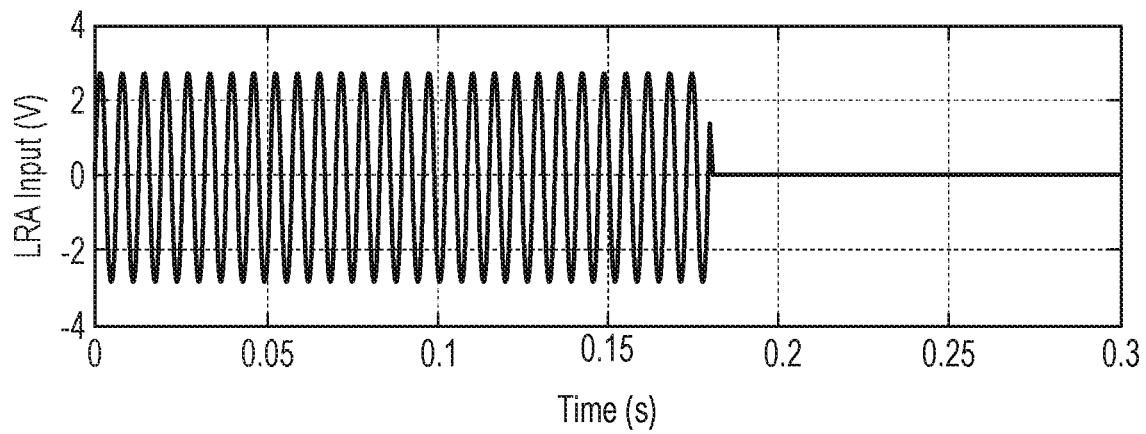
FIG. 1A illustrates an example voltage input into a haptic transducer.
Figure 1B:
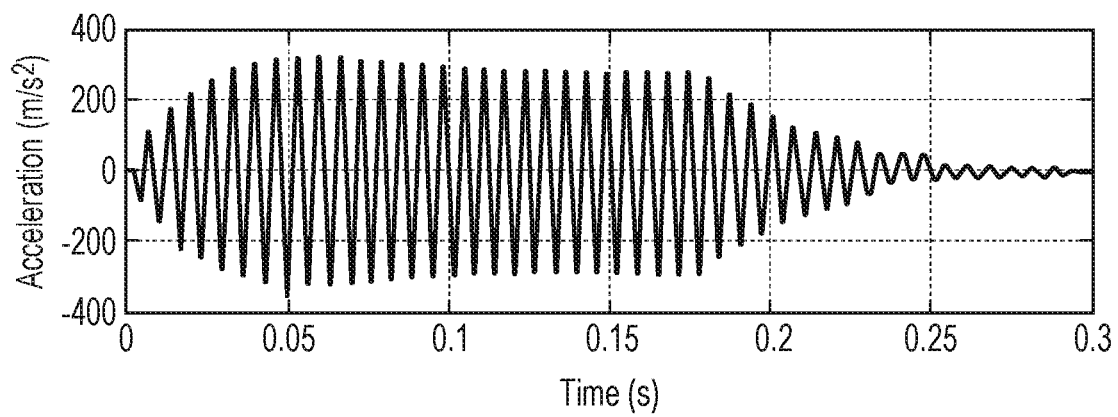
FIG. 1B illustrates the corresponding response of the haptic transducer to the voltage signal illustrated in FIG. 1A in accordance with the prior art.
Figure 2:
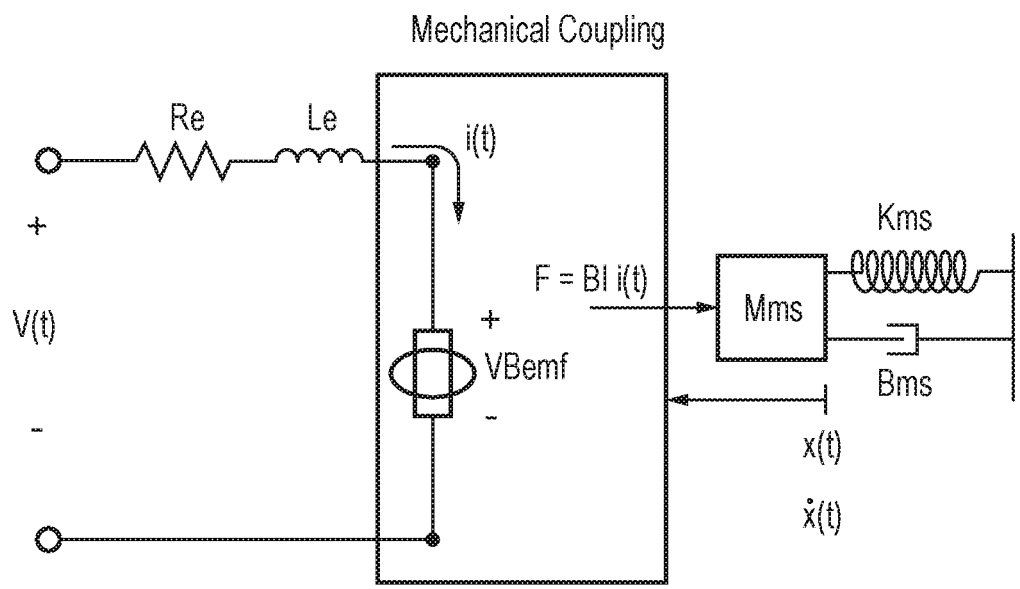
FIG. 2 illustrates an example of a Linear Resonant Actuator (LRA) modelled as a linear system.

FIG. 2 illustrates an example of a Linear Resonant Actuator (LRA) modelled as a linear system. LRAs are non-linear components that may behave differently depending on, for example, the voltage levels applied, the operating temperature, and the frequency of operation. However, these components may be modelled as linear components within the certain conditions. In this example, the LRA is modelled as a third order system having electrical and mechanical elements.

Figure 3:
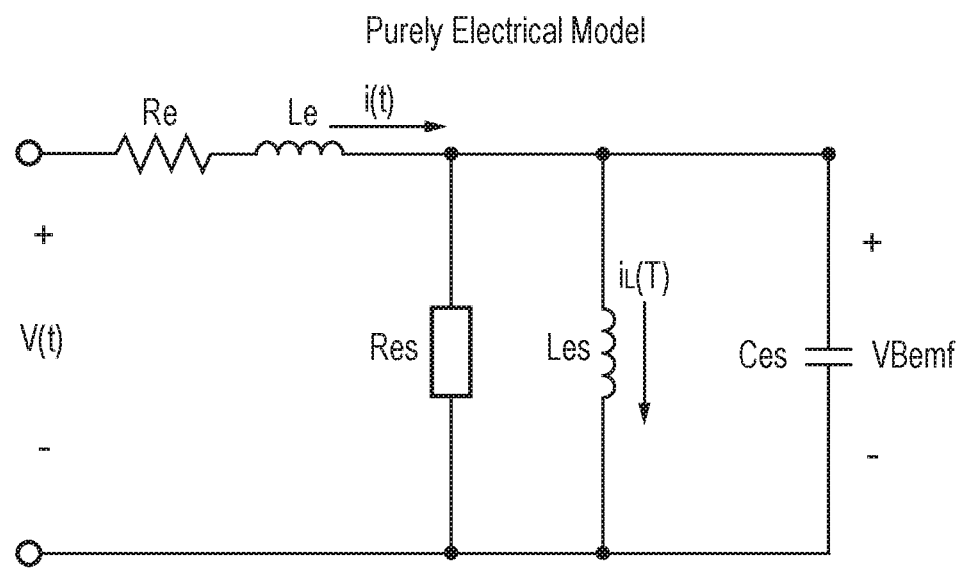
FIG. 3 illustrates an example of a Linear Resonant Actuator (LRA) modelled as a purely electrical system.

Alternatively, an LRA may be modelled as a purely electrical circuit as illustrated in FIG. 3, with a resistor Res, inductor Les and capacitor Ces connected in parallel representing the mechanical attributes of the motion of the moving mass in the LRA. The values of Res, Ces and Les may be modelled for each individual haptic transducer. For example, test frequencies may be utilised to determine the value of each parameter (Le, Re, Res, Ces, Les) of the model for a particular haptic transducer.

It will be appreciated that the electrical model illustrated in FIG. 3 is an example electrical model, and that other types of model for a haptic transducer may be used in the embodiments described herein.

The voltage across the capacitor Ces represents the back electromotive force voltage in the transducer, $V_B$. This voltage may be modelled as being proportional to the speed of the moving mass in the transducer. The current through the inductor $I_L$ may be modelled as being proportional to the position of the moving mass in the transducer.

It is also possible to represent the state of the haptic transducer system using a state equation. This state equation relates the value of variables at a future time to the value of variables at a current time in the system.

For example, a Kalman filter may be used to estimate the state of a system based on the previous states in the system.

For example, a state equation for a Kalman filter may be illustrated as:

$$\hat{x}_{k|k-1} = F_k \hat{x}_{k-1|k-1} + B_k u_k, \text{ where} \quad (1)$$

$F_k$ comprises a state-transition model; $x_{k-1|k-1}$ is the posteriori state estimate at time k−1 given observations up to and including at time k−1, $x_{k|k-1}$ is the a priori state estimate of x at time k given observations up to and including at time k−1, and $B_k$ is the control-input model which is applied to the control vector $u_k$.

For the system illustrated in FIG. 3, the state equation for the haptic transducer equation (1) may be written as:

$$\begin{bmatrix} \dot{I} \\ \dot{I}_L \\ \dot{V}_B \end{bmatrix} = \begin{bmatrix} -\frac{Re}{Le} & 0 & -\frac{1}{Le} \\ 0 & 0 & \frac{1}{Les} \\ \frac{1}{Ces} & -\frac{1}{Ces} & \frac{1}{ResCes} \end{bmatrix} \begin{bmatrix} I \\ I_L \\ V_B \end{bmatrix} + \begin{bmatrix} \frac{1}{Le} \\ 0 \\ 0 \end{bmatrix} V_{IN} \quad (2)$$

where $\begin{bmatrix} \dot{I} \\ \dot{I}_L \\ \dot{V}_B \end{bmatrix}$ is a state vector, $\hat{x}_{k|k-1}$ representing the values of I, $I_L$ and $V_B$ at a time k given observations up to and including at time k−1, and $$\begin{bmatrix} I \\ I_L \\ V_B \end{bmatrix}$$

is a state vector, $\hat{x}_{k-1|k-1}$ representing the values of I, $I_L$ and $V_B$ at a time k−1 given observations up to and including at time k−1. The values of Le, Re, Les, Res and Ces may be derived from the electrical model of the particular transducer, and $V_{IN}$ is the terminal voltage across the haptic transducer.

In this example, the state transition model $F_k$ may be given as:

$$F_k = \begin{bmatrix} -\frac{Re}{Le} & 0 & -\frac{1}{Le} \\ 0 & 0 & \frac{1}{Les} \\ \frac{1}{Ces} & -\frac{1}{Ces} & \frac{1}{ResCes} \end{bmatrix}. \quad (3)$$

The control-input model $B_k$ may be given as:

$$B_k = \begin{bmatrix} \frac{1}{Le} \\ 0 \\ 0 \end{bmatrix} \quad (4)$$

And the control vector $u_k = V_{IN}$.

Figure 4:
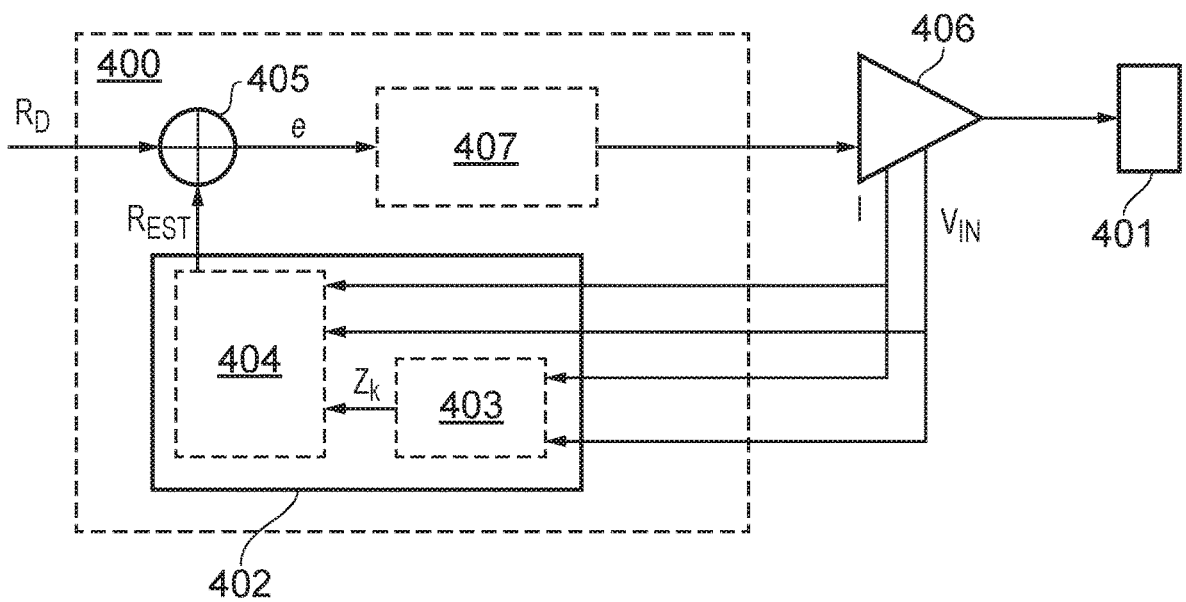
FIG. 4 illustrates an example of a controller 400 for providing a driving voltage $V_D$ to a haptic transducer 401 in accordance with some embodiments.

FIG. 4 illustrates an example of a controller 400 for providing a driving signal V(t) to a haptic transducer 401. In this example, the haptic transducer comprises a LRA, however, it will be appreciated that any form of haptic transducer may be utilised, and that a model for the haptic transducer may be adjusted accordingly.

The terminal voltage $V_{IN}$ and current across the haptic transducer I may be measured. For example, the terminal voltage $V_{IN}$ may be measured using a voltage meter across the input to the haptic transducer. The current across the haptic transducer I may be measured by measuring the voltage across a shunt resistor on a signal path to the haptic transducer.

The controller 400 comprises an estimation block 402 configured to, based on an electrical model of the haptic transducer and the voltage and the current of the driving signal, estimate an estimated electrical response, $R_{EST}$ of the transducer representative of movement of a mass in the transducer. The electrical model may comprise the values of Le, Re, Les, Res and Ces as illustrated in FIG. 3.

The estimated electrical response of the transducer may be an estimate at time k-1 of what the electrical response will be at a time k, based on a previous estimate of the electrical response.

For example, the estimated electrical response may comprise estimate of the back electromotive force (EMF) voltage, $V_B$, in the haptic transducer, wherein the back EMF voltage in the haptic transducer is representative of a velocity of the mass in the haptic transducer. Alternatively or additionally, the estimated electrical response may comprise an estimate of an inductor current, $I_L$, in the transducer, wherein the inductor current in the transducer is representative of an excursion of the mass in the transducer. It will be appreciated that any electrical response or combination of electrical responses which represent movement of the moving mass of the haptic transducer may be used.

In examples where the estimated electrical response comprises an estimate of the back EMF voltage $V_B$, a modelled electrical response at a time k-1 may be estimated as:

$$V_B = V_{IN} - ReI - Le\frac{dI}{dt} \quad (5)$$

In examples wherein the estimated electrical response at a time k comprises an estimate of the inductor current $I_L$, a modelled electrical response at a time k~1 may be estimated as:

$$I_L = I - Ces\left(\frac{dV_B}{dt}\right) - \frac{V_B}{Res}, \quad (6)$$

where back EMF voltage $V_B$ is calculated as illustrated in equation (5).

Referring to FIG. 4, therefore, the estimation block 402 may comprise a state modelling block 403 configured to model or observe the electrical response at time k. The modelled electrical response at time k-1 may be given as $z_{k-1}$. As shown above in equations (5) and (6), $z_{k-1}$ may be calculated based on the measurements of current I and voltage $V_{IN}$, along with the modelled values of Ces, Res, Re and Le from the electrical model of the haptic transducer.

In other words, the state modelling block 403 may be configured to determine a modelled electrical response $z_{k-1}$ based on the voltage and the current of the driving signal and the electrical model of the transducer.

The estimation block 402 may then further comprise a smooth state estimator, for example a Kalman filter 404, configured to receive the modelled electrical response $z_{k-1}$. It will be appreciated that any suitable state estimator or state observer system, for example a sliding mode observer or a Luenberger observer, may be used.

The smooth state estimator may be configured to estimate the estimated electrical response of the transducer based on a previous estimated electrical response and a state equation, for example equation (2), wherein the state equation is based on the electrical model of the transducer. In other words, the state equation for a smooth state estimator may utilize parameters determined from the electrical model of the transducer. The state equation comprises a state transition model, for example $F_k$ in equation (2), for applying to the previous estimate of the electrical response. The state transition model may comprise estimations of internal parameters of the electrical model of the transducer.

In particular, the state equation may comprise a Kalman Filter state equation, a Luenberger state equation, or a sliding mode observer state equation, depending on the type of state estimator used.

The Kalman filter 404 may be used to enhance the process of estimating the estimated electrical response, and may mitigate the effect of noise measurements as well as parameter mismatch.

The Kalman filter 404 may then first update a previous estimated electrical response, $\hat{x}_{k-1|k-2}$, which may be an estimate of the electrical response at time k-1 (give observations up to a time k-2). For example, the Kalman filter may update the previous estimated electrical response based on a comparison, $\tilde{y}_k$ between the modelled electrical response and the previous estimated electrical response $\hat{x}_{k-1|k-2}$.

The updated previous electrical response $\hat{x}_{k-1|k-1}$, may therefore be given as:

$$\hat{x}_{k-1|k-1} = \hat{x}_{k-1|k-2} + K_k\tilde{y}_k. \quad (7)$$

The modelled electrical response, $z_{k-1}$ may represent the actual current model of the electrical response based on current measurements of the voltage and current across the transducer. By comparing this response to the updated estimate made by the Kalman filter at a previous time, $\hat{x}_{k-1|k-1}$, the error in the Kalman filter may be corrected for. How aggressive this correction is at each stage in the Kalman filter may be controlled by the Kalman gain $K_k$.

The Kalman filter may then predict the estimated electrical response $\hat{x}_{k|k-1}$ as in equation (1):

$$\hat{x}_{k|k-1} = F_k\hat{x}_{k-1|k-1} + B_ku_k, \quad (1)$$

The equation:

$$y = \begin{bmatrix} 1 & 0 & 0 \\ 0 & 0 & 1 \end{bmatrix}\begin{bmatrix} I \\ I_L \\ V_B \end{bmatrix}, \quad (8)$$

may be used to extract the variables output from the controller 400 which may either be measured or estimated. For example, the current I may be measured directly and may be used to enhance the model estimator for estimated back EMF voltage $V_B$. In this example, voltage $V_B$ is the control variable of interest, and may be estimated, for example, using a $2^{nd}$ order estimation (i.e. $V_B = V_{IN} - Re*I$).

In this example, inductor current $I_L$ is neither measured nor estimated, however, in some examples, inductor current $I_L$ may be utilized as the control variable and may be estimated as illustrated in equation (6) or using a second order approximation.

The Kalman filter 404 may also be tuned to respond with minimal delay and high accuracy in the operating regions of the haptic transducer.

Figure 5A:
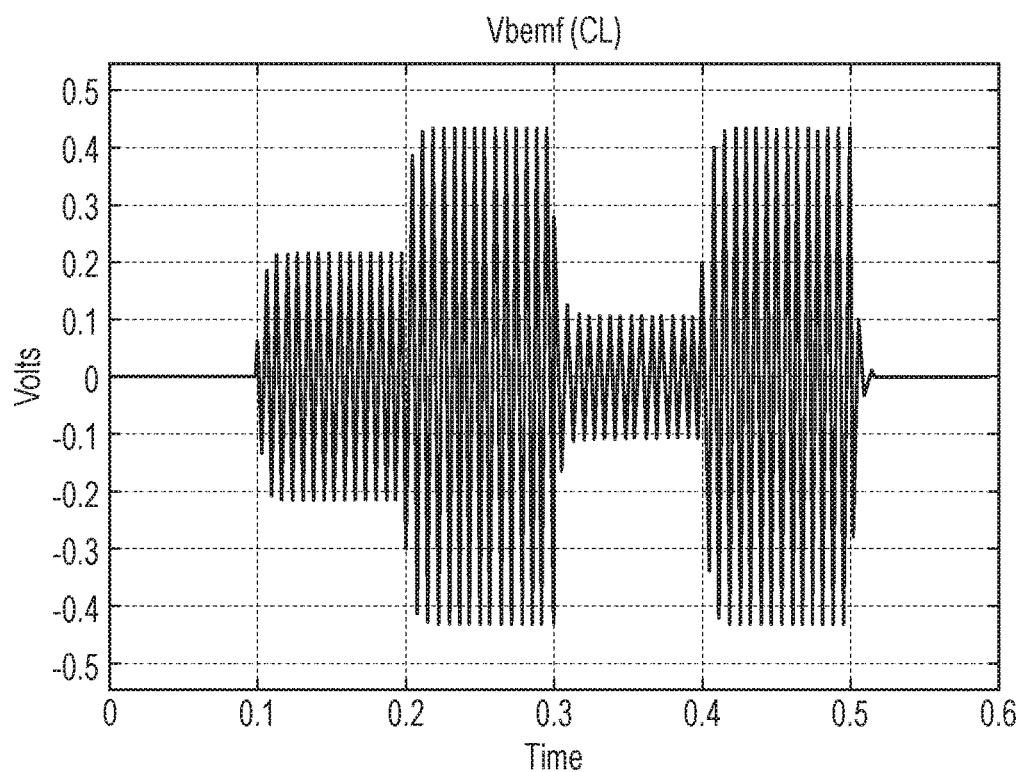
FIG. 5A is a graph illustrating an example of a desired electrical response in a haptic transducer.

Returning to FIG. 4, the controller 400 further comprises a comparison block 405 configured to compare the estimated electrical response, $R_{EST}$, to a desired electrical response $R_D$. The desired electrical response may for example illustrate the desired movement of the haptic transducer 401. An example of a desired electrical response, (in this case a desired back EMF voltage $V_B$) is illustrated in FIG. 5A.

The comparison block may, for example, be configured to subtract the estimated electrical response, $R_{EST}$, from the desired electrical response, $R_D$. The error signal, e, may then be input into an amplifier 406 to generate the driving signal $V_D$. However, in some examples, the error signal may be processed by a processing block 407 before inputting the error signal into the amplifier 406. For example, the processing block 407 may apply a fixed gain to the error signal, e. Additionally or alternatively to applying a fixed gain and feeding it to the VCO or DCO, the processing block 407 may also comprise a controller that may drive the VCO or DCO smoothly, for example, the processing block 407 may comprise a Proportional, Integral and Derivative controller (or PID).

For example, the processing block 407 may use a fixed gain which may correspond to a proportional controller (P). However, the processing block 407 may also use a proportional and integral controller (PI), or a Proportional and Derivative (PD) controller. The processing block may be selected dependent on a desired control action (for example, fast convergence, noise robustness, minimum delay, etc.).

The controller 400 may therefore control the driving signal, $V_D$ into the transducer based on the comparison between the estimated electrical response and the desired electrical response. The driving signal may be related to the terminal voltage as $V_{IN}=V_D-I\, Ro$, where Ro is the impedance of the amplifier.

It will be appreciated that the controller 400 may be implemented on an integrated circuit forming part of an electronic apparatus. For example, the electronic device may comprise a haptic transducer coupled to receive a driving signal from an amplifier, as illustrated in FIG. 4. The integrated circuit comprising the controller may then control the driving signal as illustrated in FIG. 4.

The electronic apparatus may comprise at least one of: a portable device; a battery power device; a computing device; a communications device; a gaming device; a mobile telephone; a personal media player; a laptop, tablet or notebook computing device.

Figure 5B:
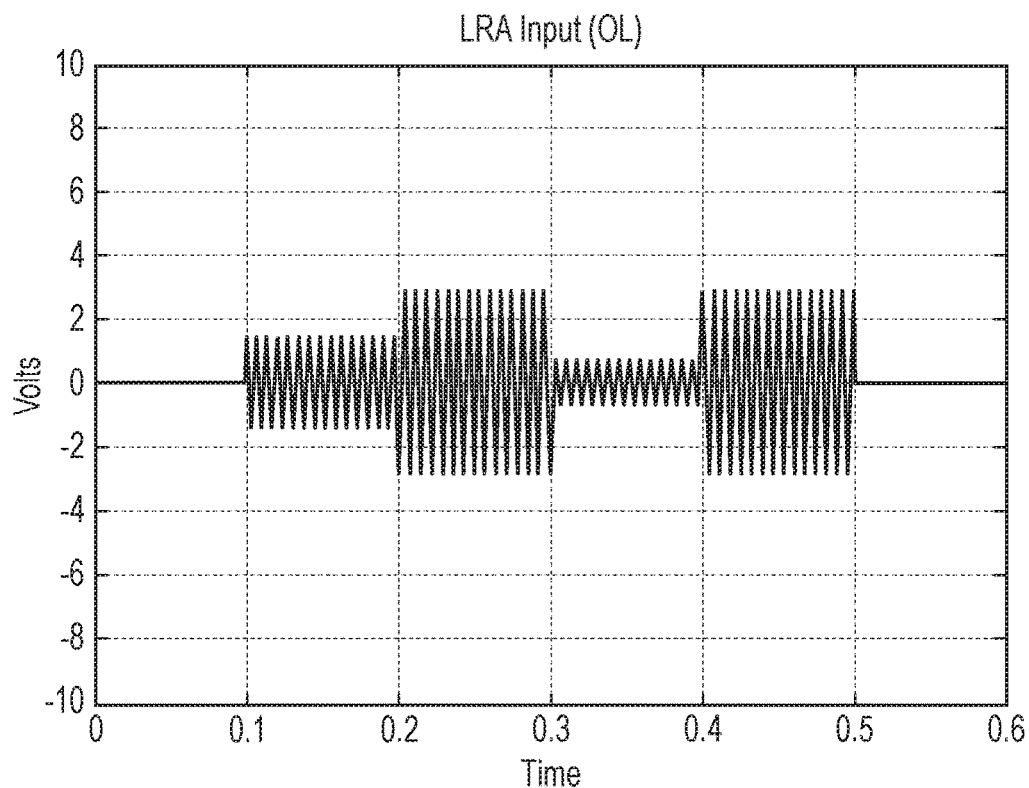
FIG. 5B is a graph illustrating an example of a driving signal for driving a haptic transducer.
Figure 5C:
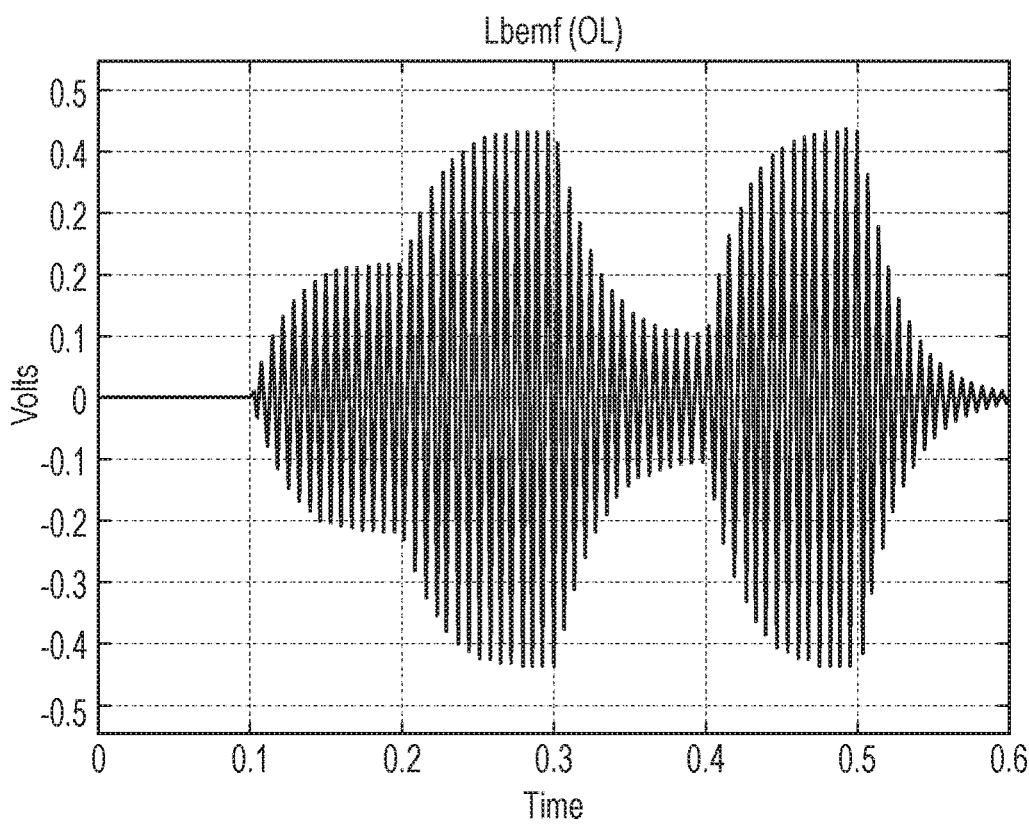
FIG. 5C is a graph illustrating an example of an actual electrical response in a haptic transducer.

FIGS. 5A and 5C illustrate example back EMF responses in a haptic transducer. It will be appreciated that other electrical responses, for example, the inductor current $I_L$ may be equally used to control the driving signal as illustrated in FIG. 4.

The FIG. 5A illustrates the desired back EMF voltage which represents the desired movement of the transducer.

However, should the driving signal not take into account any acceleration or deceleration of the haptic transducer, for example, by using an input signal as illustrated in FIG. 5B with the intention of creating the back EMF voltage response illustrated in FIG. 5A, the actual resulting back EMF voltage across the haptic transducer may be as illustrated in FIG. 5C.

In FIG. 5B, at 0.1 s, the driving signal $V_{IN}$ is set to oscillate at a magnitude of 1.5 V. This set magnitude is intended to result in a back EMF of 0.2 V in the haptic transducer. However, as illustrated in FIG. 5C, the haptic transducer in this example, actually takes 0.05 s for the back EMF voltage, representative of the speed of the moving mass in the haptic transducer, to increase from 0 to 0.2 V in magnitude.

Similarly, at 0.2 s in FIG. 5B, the driving signal is increased to 2.5 V in magnitude. This set magnitude is intended to result in a back EMF voltage of 0.45 V. However, as illustrated in FIG. 5C, the haptic transducer in this example actually takes 0.05 s for the back EMF voltage, representative of the speed of the moving mass in the haptic transducer, to increase from 0 to 0.2 V in magnitude.

Figure 5D:
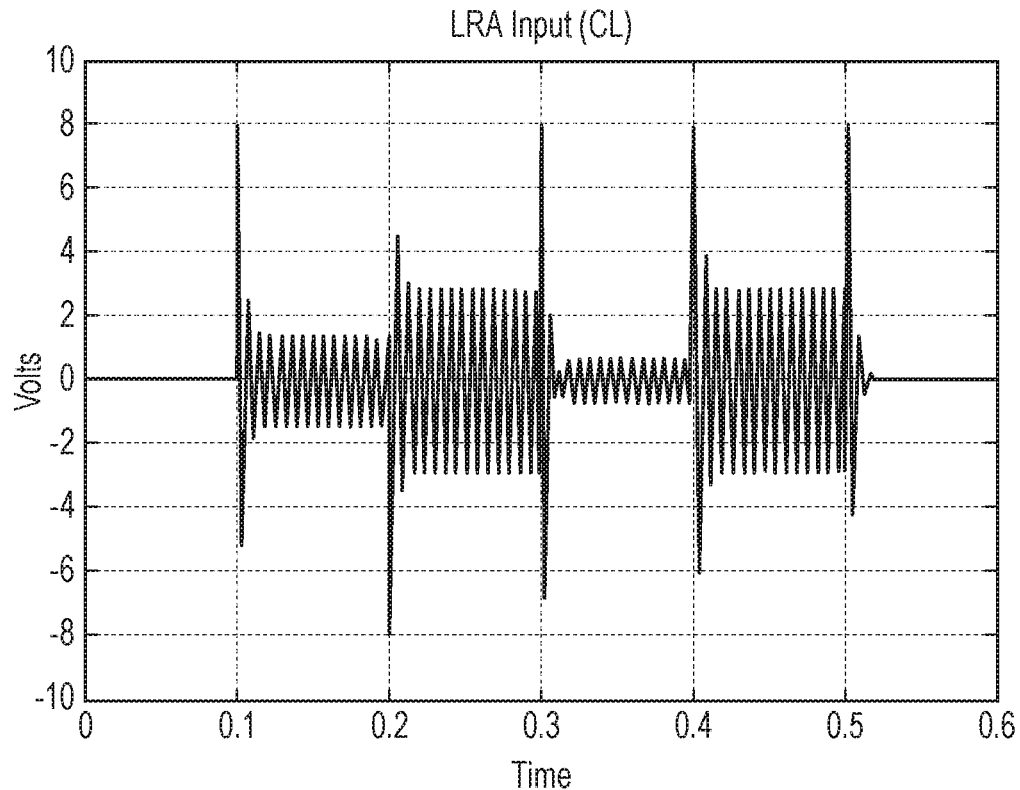
FIG. 5D is a graph illustrating an example of a controlled driving signal for driving a haptic transducer in accordance with some embodiments.

However, by utilizing the comparison between the estimated back EMF voltage and the desired back EMF voltage to derive the driving signal $V_{IN}$, for example, as illustrated in FIG. 5D, the resulting back EMF may be as illustrated in FIG. 5A. In other words, the desired electrical response, or a good estimate of the desired electrical response may be reproduced in the haptic transducer.

As illustrated in FIG. 5D, as the difference between the estimated back EMF voltage and the desired back EMF voltage becomes greater as the desired back EMF voltage shifts from one value to another, the error signal may produce a spike, e.g. at times 0.1 s, 0.2 s, 0.3 s, 0.4 s and 0.5 s. These spikes in the error signal, when used to generate the input signal $V_{IN}$, cause the haptic transducer to accelerate or decelerate quickly when the electrical response of the transducer is expected to change. These spikes therefore overdrive the transducer in one direction or another, thereby compensating for the rise and fall times illustrated in FIG. 5A.

In some examples, the spikes in the error signal may be constrained by the following criteria.

1) The inner mass may be required to not exceed a predetermined excursion limit to prevent damage of the internal components of the haptic transducer. As the inductor current represents the excursion of the haptic transducer, the desired electrical response, for example the desired inductor current, may be limited by a predetermined maximum inductor current.

2) A predetermined maximum voltage and current for the driving signal may also apply to prevent damage of the internal components of the haptic transducer. In this example, therefore, the voltage and current of the driving signal may be limited by predetermined maximum values.

Figure 6:
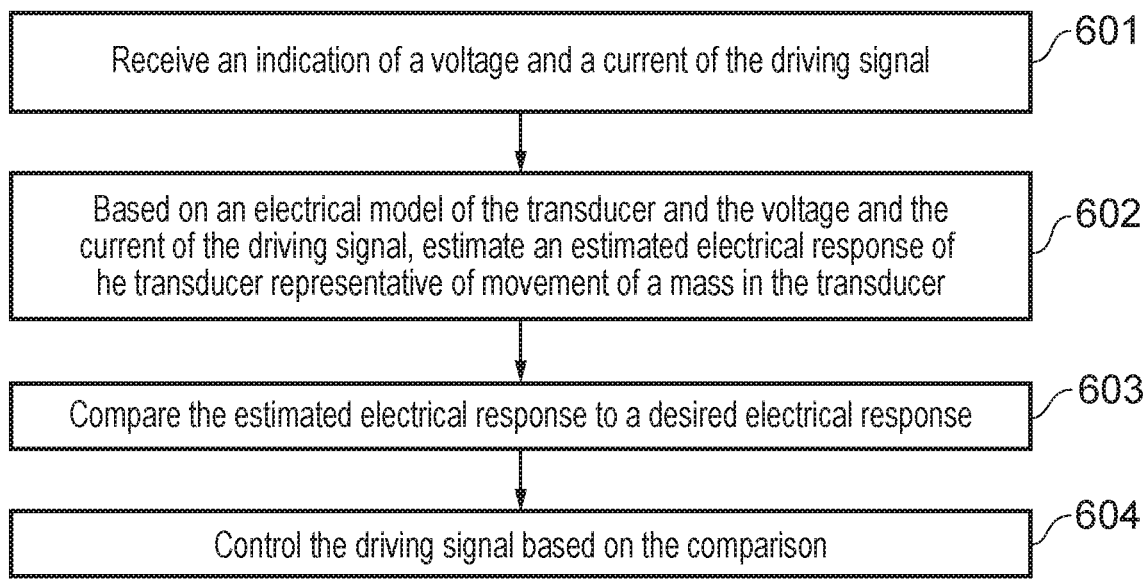
FIG. 6 is a flow chart illustrating a method of providing a driving signal to a transducer in accordance with some embodiments.

FIG. 6 illustrates a method for providing a driving signal to a transducer, wherein the driving signal is output by an amplifier.

In step 601, the method comprises receiving an indication of a voltage and a current of the driving signal.

In step 602, the method comprises, based on an electrical model of the transducer and the voltage and the current of the driving signal, estimating an estimated electrical response of the transducer representative of movement of a mass in the transducer. For example, the estimated electrical response may be estimated by a state observer, for example, a Kalman filter, as described with reference to FIG. 4.

It will be appreciated that the electrical response may comprise any electrical response, or combination of electrical responses which are representative of the movement of the moving mass in the haptic transducer. For example, the electrical response may comprise the back EMF in the haptic transducer, or the inductor current through the inductor in the electrical model of the haptic transducer.

In step 603, the method comprises comparing the estimated electrical response to a desired electrical response. For example, the estimated electrical response may be subtracted from the desired electrical response.

In step 604, the method comprises controlling the driving signal based on the comparison.

Methods and apparatus for controlling the movement of the mass inside a haptic transducer accurately are described. In particular, methods described herein utilize a smooth state estimator, such as a Kalman filter, to provide an estimate of a state of an electrical response of the haptic transducer which is representative of the movement of the haptic transducer. This estimate may then be compared against a desired electrical response in order to control the driving signal applied to the haptic transducer.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfill the functions of several units recited in the claims. Any reference numerals or labels in the claims shall not be construed so as to limit their scope. Terms such as amplify or gain include possible applying a scaling factor or less than unity to a signal.

It will of course be appreciated that various embodiments of the analog conditioning circuit as described above or various blocks or parts thereof may be co-integrated with other blocks or parts thereof or with other functions of a host device on an integrated circuit such as a Smart Codec.

The skilled person will thus recognize that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solution to problems that are described herein with regard to specific embodiments are not intended to be construed as a critical, required, or essential feature of element.

Further embodiments likewise, with the benefit of this disclosure, will be apparent to those having ordinary skill in the art, and such embodiments should be deemed as being encompasses herein.

The invention claimed is:

1. A method for providing a driving signal to a transducer, wherein the driving signal is output by an amplifier, the method comprising:
   receiving an indication of a voltage and a current of the driving signal;
   based on an electrical model of the transducer and the voltage and the current of the driving signal, estimating an estimated electrical response of the transducer representative of movement of a mass in the transducer;
   comparing the estimated electrical response to a desired electrical response; and
   controlling the driving signal based on the comparison;
   wherein the step of estimating an estimated electrical response of the transducer comprises:
      estimating the estimated electrical response of the transducer based on a previous estimated electrical response and a state equation, wherein the state equation is based on the electrical model of the transducer.

2. The method of claim 1 further comprising:
   first updating the previous estimated electrical response based on a comparison between a modelled electrical response and the previous estimated electrical response, wherein
   the modelled electrical response is determined based on the voltage and the current of the driving signal, and the electrical model of the transducer.

3. The method of claim 1 wherein the state equation comprises one equation among a Kalman Filter state equation, a Luenberger state equation, and a sliding mode observer state equation.

4. The method of claim 1 wherein the estimated electrical response comprises an estimate of the back electromotive force voltage in the transducer, wherein the back electromotive force voltage in the transducer is representative of a velocity of the mass in the transducer.

5. The method of claim 1 wherein the estimated electrical response comprises an estimate of an inductor current in the transducer, wherein the inductor current in the transducer is representative of an excursion of the mass in the transducer.

6. The method of claim 1 wherein the step of comparing comprises:
   subtracting the estimated electrical response from the desired electrical response to provide an error signal.

7. The method of claim 1 wherein the state equation comprises a state transition model for applying to the previous estimate of the electrical response, wherein the state transition model comprises estimations of internal parameters of the electrical model of the transducer.

8. The method of claim 1 wherein the voltage and current of the driving signal are limited by predetermined maximum values.

9. The method of claim 4 wherein the desired electrical response comprises a desired back electromotive force voltage representative of a desired velocity of the mass in the transducer.

10. The method of claim 5 wherein the desired electrical response comprises a desired inductor current representative of a desired excursion of the mass in the transducer.

11. The method of claim 6 wherein the step of controlling comprises:
determining the driving signal by applying a gain to the error signal.

12. The method of claim 10 wherein the desired electrical response is limited by a predetermined maximum inductor current.

13. A controller for controlling a driving signal to a transducer, wherein the driving signal is output by an amplifier, the controller comprising:
an estimation block configured to:
receive an indication of a voltage and a current of the driving signal; and
based on an electrical model of the transducer and the voltage and the current of the driving signal, estimate an estimated electrical response of the transducer representative of movement of a mass in the transducer; and
a comparison block configured to compare the estimated electrical response to a desired electrical response; wherein the controller is configured to control the driving signal based on the comparison;
wherein the estimation block comprises a smooth state estimator configured to:
estimate the estimated electrical response of the transducer based on a previous estimated electrical response and a state equation, wherein the state equation is based on the electrical model of the transducer.

14. The controller of claim 13, further comprising:
a state modelling block configured to determine a modelled electrical response based on the voltage and the current of the driving signal and the electrical model of the transducer, wherein the smooth state estimator is further configured to:
first update the previous estimated electrical response based on a comparison between the modelled electrical response and the previous estimated electrical response.

15. The controller of claim 13 wherein the state equation comprises one equation among a Kalman Filter state equation, a Luenberger state equation, and a sliding mode observer state equation.

16. The controller of claim 13 wherein the estimated electrical response comprises an estimate of the back electromotive force voltage in the transducer, wherein the back electromotive force voltage in the transducer is representative of a velocity of the mass in the transducer.

17. The controller of claim 13 wherein the estimated electrical response comprises an estimate of an inductor current in the transducer, wherein the inductor current in the transducer is representative of an excursion of the mass in the transducer.

18. The controller of claim 13 wherein the comparison block is configured to subtract the estimated electrical response from the desired electrical response to provide an error signal.

19. The controller of claim 13 wherein the state equation comprises a state transition model for applying to the previous estimate of the electrical response, wherein the state transition model comprises estimations of internal parameters of the electrical model of the transducer.

20. The controller of claim 13 wherein the voltage and current of the driving signal are limited by predetermined maximum values.

21. The controller of claim 16 wherein the desired electrical response comprises a desired back electromotive force voltage representative of a desired velocity of the mass in the transducer.

22. The controller of claim 17 wherein the desired electrical response comprises a desired inductor current representative of a desired excursion of the mass in the transducer.

23. The controller of claim 18 wherein the controller is configured to determine the driving signal by applying a gain to the error signal.

24. The controller of claim 22 wherein the desired electrical response is limited by a predetermined maximum inductor current.

25. An electronic apparatus comprising:
a haptic transducer; and
an integrated circuit comprising:
an amplifier configured to output a driving signal to the haptic transducer; and
a controller comprising:
an estimation block configured to receive an indication of a voltage and a current of the driving signal; and based on an electrical model of the transducer and the voltage and the current of the driving signal, estimate an estimated electrical response of the transducer representative of movement of a mass in the transducer; and
a comparison block configured to compare the estimated electrical response to a desired electrical response; wherein the controller is configured to control the driving signal based on the comparison;
wherein estimating an estimated electrical response of the transducer comprises estimating the estimated electrical response of the transducer based on a previous estimated electrical response and a state equation, wherein the state equation is based on the electrical model of the transducer.

26. The electronic apparatus as claimed in claim 25 wherein said apparatus is one among the following: a portable device; a battery power device; a computing device; a communications device; a gaming device; a mobile telephone; a personal media player; a laptop, tablet, and notebook computing device.

* * * * *